United States Patent
Mirhaj et al.

(10) Patent No.: US 10,312,927 B1
(45) Date of Patent: Jun. 4, 2019

(54) CALIBRATION FOR TIME-INTERLEAVED ANALOG-TO-DIGITAL CONVERTERS AND SIGNAL GENERATORS THEREFOR

(71) Applicant: QUALCOMM Incorporated, San Diego, CA (US)

(72) Inventors: Seyed Arash Mirhaj, San Diego, CA (US); Elias Dagher, Laguna Niguel, CA (US); Yongjian Tang, San Diego, CA (US); Dinesh Alladi, San Diego, CA (US); Masoud Ensafdaran, San Diego, CA (US); Lei Sun, San Diego, CA (US); Anand Meruva, San Diego, CA (US); Yuhua Guo, San Diego, CA (US); Balasubramanian Sivakumar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/935,988

(22) Filed: Mar. 26, 2018

(51) Int. Cl.
*H03K 4/08* (2006.01)
*H03M 1/10* (2006.01)

(52) U.S. Cl.
CPC ............ *H03M 1/1033* (2013.01); *H03K 4/08* (2013.01)

(58) Field of Classification Search
CPC .................................................. H03M 1/1033
USPC .......................................................... 341/120
See application file for complete search history.

(56) References Cited

U.S. PATENT DOCUMENTS

| | | | | |
|---|---|---|---|---|
| 6,111,913 A | * | 8/2000 | Murdock ............. | H04N 19/159 375/240.03 |
| 6,430,180 B1 | * | 8/2002 | Bohm ................... | H04J 3/0602 370/369 |
| 7,148,828 B2 | | 12/2006 | Fernandez et al. | |
| 9,000,962 B1 | * | 4/2015 | Leuciuc ............. | H03M 1/1033 341/120 |
| 9,401,726 B2 | | 7/2016 | Ragab et al. | |
| 9,608,652 B2 | * | 3/2017 | Lee ........................ | H03M 1/002 |

(Continued)

FOREIGN PATENT DOCUMENTS

CN        104702280 A        6/2015

OTHER PUBLICATIONS

Tashi T-H., et al., "Time-Interleaved Analog-To-Digital Converters for Digital Communications", Semantic Scholar, Allen Institute for Intelligence, 2004, 6 Pages.

*Primary Examiner* — Lam T Mai
(74) *Attorney, Agent, or Firm* — Patterson & Sheridan, L.L.P.

(57) ABSTRACT

Certain aspects of the present disclosure provide methods and apparatus for calibrating time-interleaved analog-to-digital converter (ADC) circuits and generating a suitable signal for such calibration. Certain aspects provide a signal generator for calibrating a time-interleaved ADC circuit having a plurality of channels. The signal generator generally includes a pattern generator configured to receive a periodic signal and to output a bitstream based on the periodic signal and a conversion circuit having an input coupled to an output of the pattern generator and configured to generate a waveform based on the bitstream. The bitstream has a bit pattern with a total number of bits that shares no common factor with a number of the channels and includes a relatively lower frequency component combined with a relatively higher frequency component.

21 Claims, 11 Drawing Sheets

(56) References Cited

U.S. PATENT DOCUMENTS

| | | | |
|---|---|---|---|
| 2011/0268188 A1* | 11/2011 | Kim | H04N 19/176 375/240.12 |
| 2012/0262318 A1 | 10/2012 | Straayer et al. | |
| 2013/0176154 A1* | 7/2013 | Bonaccio | H03M 1/182 341/118 |
| 2013/0346721 A1* | 12/2013 | Giovannini | G11C 7/222 711/167 |

* cited by examiner

CALIBRATION FOR TIME-INTERLEAVED ANALOG-TO-DIGITAL CONVERTERS AND SIGNAL GENERATORS THEREFOR

TECHNICAL FIELD

Certain aspects of the present disclosure generally relate to electronic circuits and, more particularly, to time-interleaved analog-to-digital converters (ADCs) and signal generators for calibration of such ADCs.

BACKGROUND

An analog-to-digital converter (ADC) is an electronic circuit used to convert an analog signal to a digital signal, typically for performing signal processing in the digital domain. Several types of ADCs are available, each with varying advantages and disadvantages. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption. A time-interleaved ADC employs a number (m) of parallel ADCs (known as "sub-ADCs"), where each sub-ADC samples data every $m^{th}$ cycle of the effective sampling clock. In this manner, the sampling rate is increased m times compared to what each individual sub-ADC can achieve.

SUMMARY

Certain aspects of the present disclosure generally relate to calibrating time-interleaved analog-to-digital converter (ADC) circuits and generating a suitable signal for such calibration.

Certain aspects of the present disclosure provide a signal generator for calibrating a time-interleaved ADC circuit having a plurality of channels. The signal generator generally includes a pattern generator configured to receive a periodic signal and output a bitstream based on the periodic signal and a conversion circuit having an input coupled to an output of the pattern generator and configured to generate a waveform based on the bitstream. The bitstream has a bit pattern with a total number of bits that shares no common factor with a number of the channels and includes a relatively lower frequency component combined with a relatively higher frequency component.

Certain aspects of the present disclosure provide a method of generating a waveform for calibrating a time-interleaved ADC circuit having a plurality of channels. The method generally includes receiving a periodic signal; generating a bitstream based on the periodic signal, wherein the bitstream has a bit pattern with a total number of bits that shares no common factor with a number of the channels and includes a relatively lower frequency component combined with a relatively higher frequency component; and generating the waveform based on the bitstream.

Certain aspects of the present disclosure provide an apparatus for generating an analog waveform for calibrating a time-interleaved ADC circuit having a plurality of channels. The apparatus generally includes means for generating a digital bitstream based on a periodic signal, wherein the bitstream has a bit pattern with a total number of bits that shares no common factor with a number of the channels and includes a relatively lower frequency component combined with a relatively higher frequency component; and means for generating the waveform based on the bitstream.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
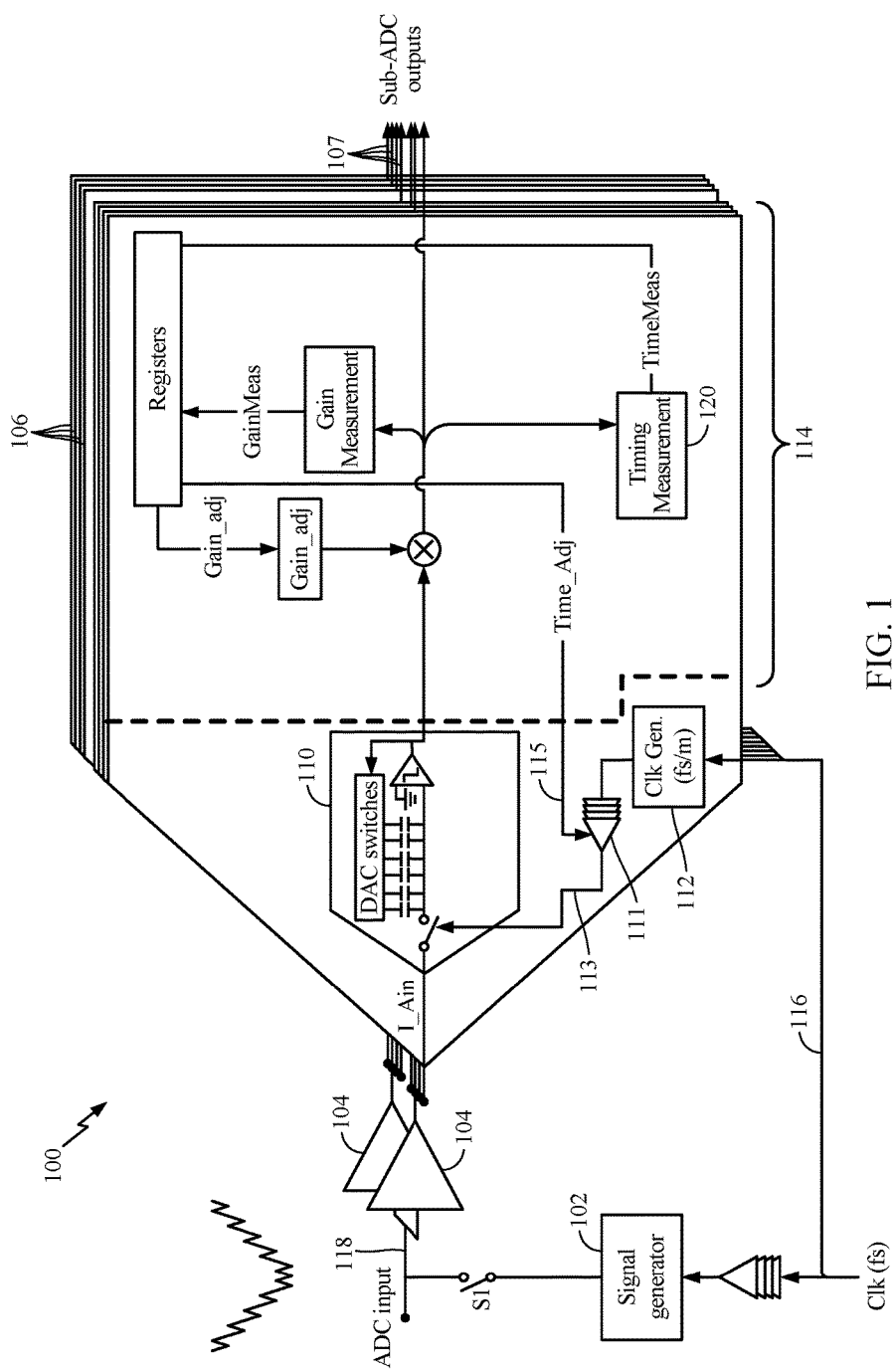
FIG. 1 is a block diagram of an example time-interleaved analog-to-digital converter (ADC) circuit with a signal generator for calibrating the ADC circuit, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Time-Interleaved ADC Circuit

Time-interleaved analog-to-digital converters (ADCs) offer a feasible solution for high frequency, mid-to-high resolution applications. However, it is well known that time-interleaved ADCs suffer from mismatch between different channels of the ADC. The main mismatch sources include offset, gain, sampling time, and bandwidth mismatch. These mismatches (offset, gain, clock and signal delay mismatches due to sampling time skew, and signal bandwidth) may corrupt the output spectrum by introducing spurs and unwanted images of the signal at harmonics of the channel sampling frequency (fs/m), where fs is the sampling frequency of the ADC and where m is the number of channels (i.e., the number of sub-ADCs).

There are a number of ways to address these shortcomings, including: (1) using external sources to calibrate the channels with trimming (which may increase the test time and cost significantly, and is thus mainly used in high-end lab instruments); (2) using one or more extra channels to randomize output spurs and images (which can use more area, while overall noise power does not decrease); (3) using a reference ADC either in a lower sampling frequency or the same sampling frequency (which occupies more area and involves complicated mission-mode switching); (4) using pilot signals on specific frequencies for background calibration (however, desirable frequencies may not be available due to frequency planning of the system); and (5) using background calibration and statistics of the signal (although statistical consistency between different channels might not be guaranteed in some applications). Out of all the mismatch sources, timing skew may be especially difficult to detect and correct. In many existing calibration solutions, accuracy of the timing calibration may depend on the accuracy of the gain calibration, which can result in accumulative error.

Certain aspects of the present disclosure provide techniques and apparatus for calibrating time-interleaved ADCs using a unique set of signals, which may be generated on chip (e.g., on the same integrated circuit as the ADC itself). These signals have specific characteristics that result in accurate estimation of the mismatch between different channels of a time-interleaved ADC with reasonable hardware effort.

FIG. 1 is a block diagram of an example time-interleaved ADC circuit 100 and a signal generator 102 (also known as a waveform generator), in accordance with certain aspects of the present disclosure. The time-interleaved ADC circuit 100 may include one or more buffers 104, multiple channels 106, and retiming logic (not shown). As illustrated in FIG. 1, there are eight channels 106; however, a person having ordinary skill in the art will understand that the time-interleaved ADC circuit 100 may be implemented with fewer or more than eight channels. Thus, in the example of FIG. 1, the mismatch between time-interleaved channels may introduce spurs and images of the ADC input signal at multiples of fs/8. Each of the channels 106 may include a sub-ADC 110, a channel clock generator 112, a programmable delay 111, and adjustment circuitry 114.

The signal generator 102 may be used to generate a set of signals for calibrating the time-interleaved ADC circuit 100. For certain aspects, the signal generator 102 may be implemented on the same integrated circuit (IC) (e.g., may share the same wafer-level substrate) as components of the time-interleaved ADC circuit 100 (e.g., at least the same IC as the channels 106). For other aspects, the signal generator 102 may be implemented on a different IC from that of the time-interleaved ADC circuit 100. The signal generator 102 may receive the same clock signal 116 as the channels 106 (as depicted in FIG. 1) or a clock signal that is locked to the clock signal 116 with no fractional frequency mismatch. Any delay mismatch between the clock signal 116 and the clock signal for the signal generator 102 may be adjusted by calibration.

For certain aspects, the signal generator 102 may be selectively coupled to an ADC input node 118 via a switch S1, for example, for inputting a calibration waveform into the ADC circuit 100 for time-interleaved sampling by the channels 106. In this case, the signal generator 102 may be disconnected from the ADC input node 118 during mission mode (e.g., while the ADC circuit 100 is being used to sample an analog signal input thereto (labeled "ADC input")). For other aspects, the signal generator 102 may be disabled (e.g., powered down or otherwise prevented from injecting a calibration waveform into the ADC input node 118) during the mission mode.

For certain aspects, the signal generator 102 and at least some of the components in the time-interleaved ADC circuit 100 (e.g., the sub-ADCs 110 and/or the channel clock generator 112) may share the same power supply rails (e.g., Vdd and Vss) for receiving power.

The input buffer(s) 104 may be used to buffer a circuit outputting the ADC input (e.g., an anti-aliasing filter) from being loaded by the multiple channels 106. In the example shown in FIG. 1, every four channels 106 are driven with one input buffer 104. However, the person having ordinary skill in the art will understand that the time-interleaved ADC circuit 100 may be implemented with a different number of buffers 104 (e.g., one buffer per eight channels or one buffer per two channels).

As described above, each of the channels 106 may include a sub-ADC 110, a programmable delay 111, a channel clock generator 112, and adjustment circuitry 114. The sub-ADC 110 may be implemented with any of various suitable types of ADCs, such as a successive approximation register (SAR)

ADC as shown. The channel clock generator 112 may receive the clock signal 116 and divide the frequency of the clock signal by the number of channels 106 (e.g., divide by 8) to generate a channel clock signal 113 to be used internal to that particular channel 106. The channel clock generator 112 may also adjust the phase of the channel clock signal (e.g., by one period increments of the clock signal 116), such that each of the channels 106 is sampling at a different time. For example, if the clock signal 116 is a 2 GHz signal and there are eight channels 106, the channel clock generator 112 in each channel may generate a channel clock signal 113 operating at 250 MHz, where each of the channel clock signals has a phase difference of about 500 ps (=2 GHz$^{-1}$) therebetween. The adjustment circuitry 114 in each channel 106 may be used to perform digital signal processing on the digitized sample output from the sub-ADC 110. This digital signal processing may include applying a weighting factor to, measuring a gain error based on, adjusting a gain of, measuring an offset error of, and/or adjusting an offset of the digitized sample. The adjustment circuitry 114 may also include a timing measurement block 120, and thus, the digital signal processing may also include determining a timing skew based on the digitized sample during calibration and applying a control signal 115 to the channel clock generator 112 (and more specifically to the programmable delay 111) to adjust the phase of the channel clock signal 113. Another way of resolving the time skew mismatch is by use of fractional delay digital filters. However, accurate delay filters with high resolution entail the use of many tabs, and the area and power involved may be excessive.

The retiming logic may be used to digitally merge (e.g., multiplex) the digitized samples from the outputs 107 of the channels 106 into one output sequence for the time-interleaved ADC circuit 100.

An Example Signal Generator

Figure 2:
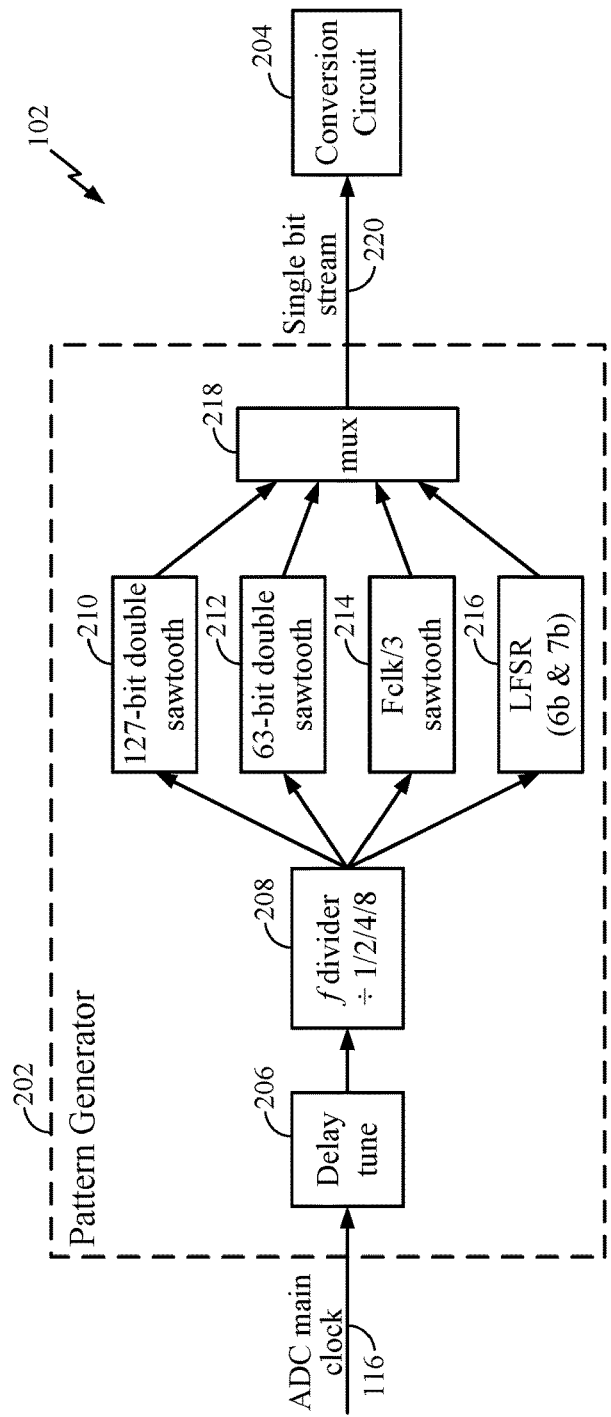
FIG. 2 is a block diagram of an example signal generator, illustrating a pattern generator and a conversion circuit, in accordance with certain aspects of the present disclosure.

FIG. 2 is a block diagram of an example signal generator 102, in accordance with certain aspects of the present disclosure. The signal generator of FIG. 2 includes a pattern generator 202 and a conversion circuit 204 having an input coupled to an output of the pattern generator. The pattern generator 202 is configured to receive a periodic signal (e.g., the clock signal 116) and generate a waveform bitstream 220 based on the periodic signal. The waveform bitstream 220 may have a bit pattern with a total number of bits that shares no common factor with the number of channels 106 (e.g., m=8). In other words, the total number of bits in the bit pattern is indivisible by the number of channels. The pattern generator 202 may include an optional delay tuning circuit 206, an optional frequency dividing circuit 208, one or more waveform bitstream generating circuits 210, 212, 214, 216, and an optional multiplexer 218.

The delay tuning circuit 206 may be configured to variably delay the periodic signal or a version of the periodic signal. The delay tuning circuit 206 may be controlled by the calibration algorithm through firmware, by a hardware finite state machine (e.g., on chip, meaning the same IC as the signal generator 102) or a controller (e.g., outside the chip). The delay range of the delay tuning circuit 206 may most likely cover at least one period of the periodic signal.

The frequency dividing circuit 208 may be configured to divide a frequency of the periodic signal or a version of the periodic signal (e.g., a delayed version of the periodic signal after processing by the delay tuning circuit 206) to generate a lower frequency periodic signal. The frequency dividing circuit 208 may be capable of frequency dividing a signal by one or more values. In the case of multiple values, a control signal may be used to select the value by which to divide the frequency of the signal. For example, the frequency of the signal may be divided by 1, by 2, by 4, by 8, or by other values. A lower clock rate entails a larger calibration signal swing. For certain aspects, when a lower divider ratio is chosen, the higher ratio divider(s) may be disabled to avoid generating low frequency spurs.

For certain aspects, the output of the delay tuning circuit 206 is coupled to the input of the frequency dividing circuit 208. For other aspects, the output of the frequency dividing circuit 208 is coupled to the input of the delay tuning circuit 206. For other aspects without a delay tuning circuit 206, the input of the pattern generator 202 may be coupled to the frequency dividing circuit 208.

Figure 3:
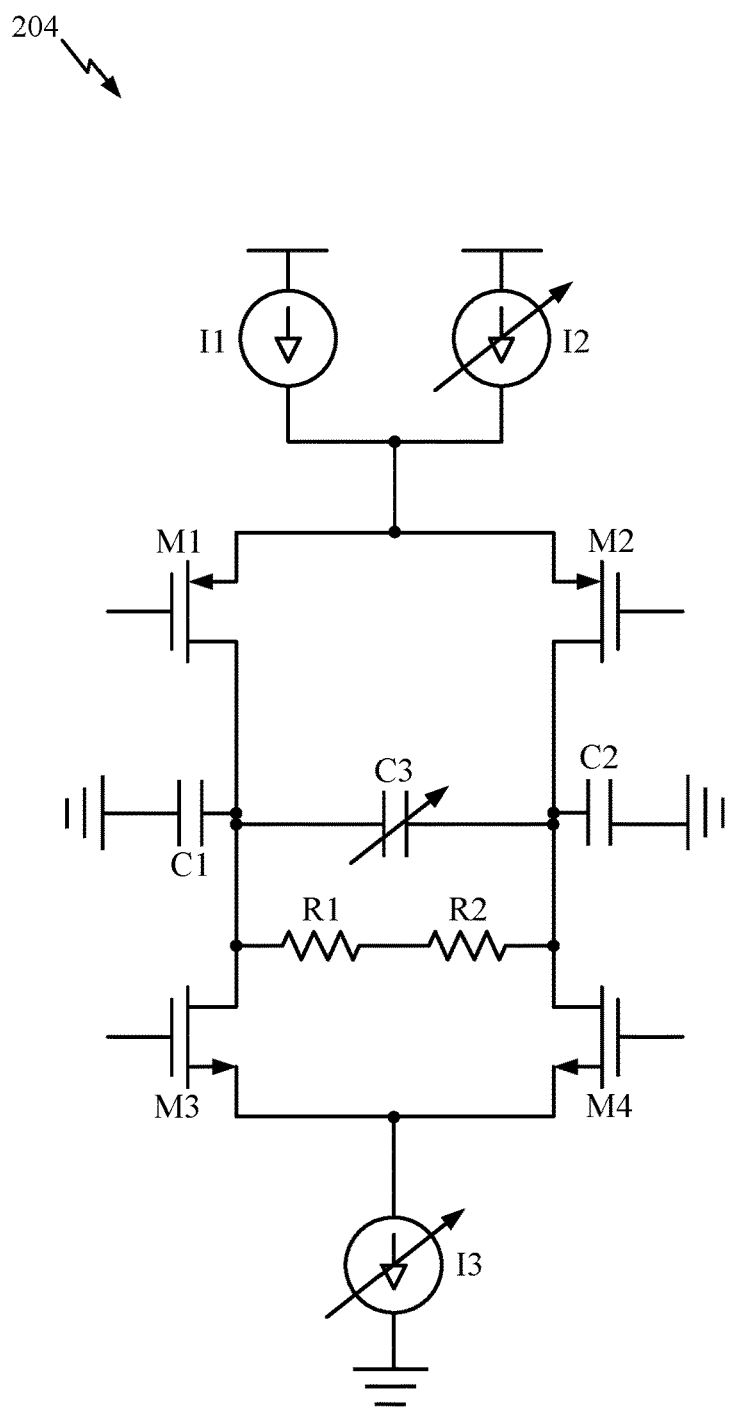
FIG. 3 is a schematic diagram of an example conversion circuit, in accordance with certain aspects of the present disclosure.

The conversion circuit 204 (also referred to as a signal generating circuit or "sig_gen") is configured to receive the waveform bitstream 220 from the pattern generator 202 and convert the bitstream to an analog signal for inputting into the time-interleaved ADC circuit 100 at the ADC input node 118. FIG. 3 is a schematic diagram of an example conversion circuit 204, in accordance with certain aspects of the present disclosure. In FIG. 3, the conversion circuit 204 is based on an integrator, which is formed by a fully differential charge pump that acts as a digital-to-analog converter (DAC) (composed of transistors M1-M4 and current sources I1-I3), loading capacitors (C1, C2, and C3), and limiting resistors (R1 and R2). The output current is integrated on both single-ended (C1 and C2) and differential capacitors (C3). The output is a ramp up or down signal depending on the switching signal polarity and may be controlled by the bitstream 220 output by the pattern generator 202. The limiting resistors (R1 and R2) may limit any differential DC offset. The ramp signal may also be affected by these limiting resistors, but the bandwidth may be very low.

Referring back to FIG. 3, in cases where there is more than one waveform bitstream generating circuit, the multiplexer 218 may be configured to select one of the multiple different waveform bitstreams as the bitstream 220 output by the pattern generator 202. The pattern generator 202 may support any of various circuits capable of generating a suitable waveform bitstream. A suitable waveform bitstream may include a relatively higher frequency component (e.g., to aid timing skew calibration) combined with a lower frequency component (e.g., to aid with gain calibration). For example, the waveforms may include a double sawtooth signal (two ramps), a single sawtooth signal (a single ramp), and/or a pseudorandom signal (e.g., implemented by a linear feedback shift register (LFSR) sequence.

Figure 4:
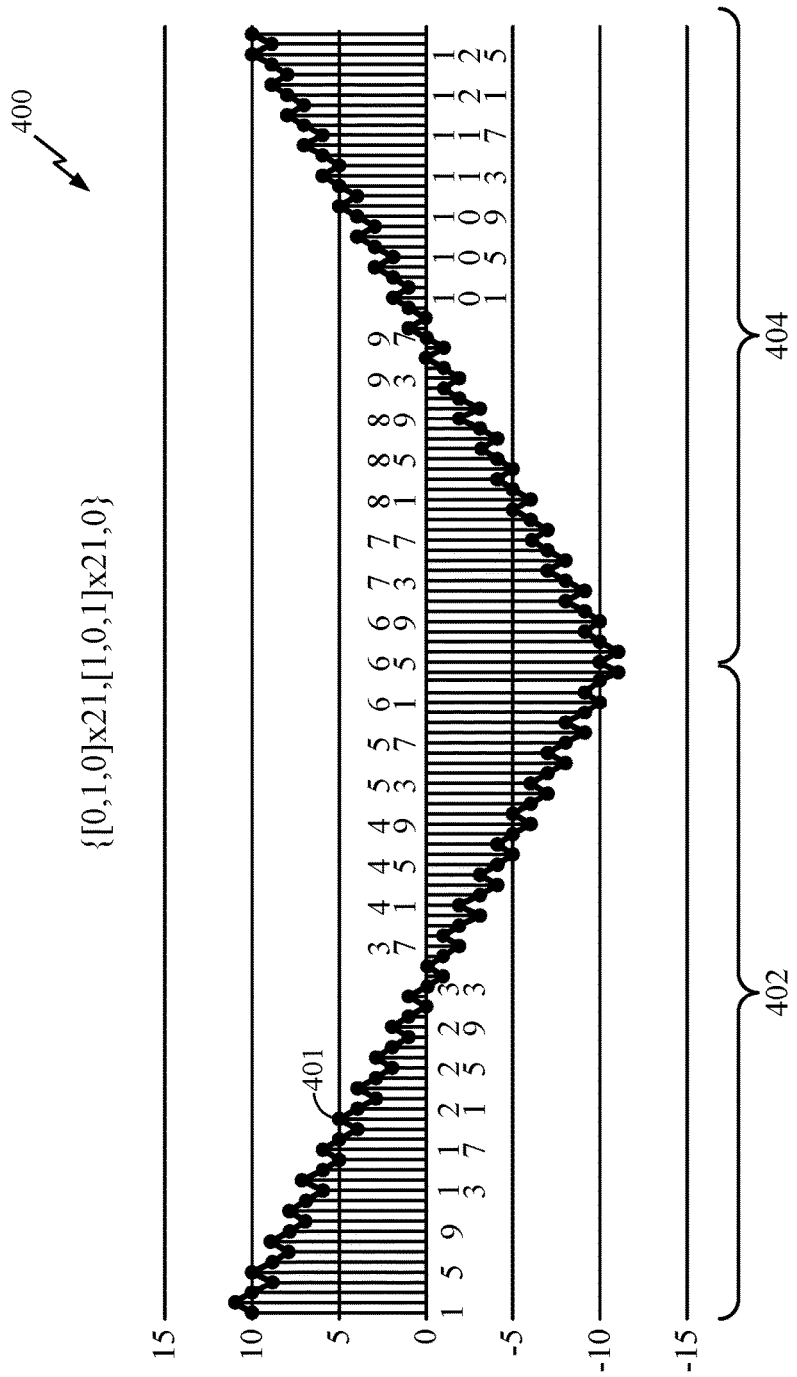
FIG. 4 is a plot of one period of an example 127-bit double sawtooth signal, normalized such that the amplitude of each segment is equal to 1, in accordance with certain aspects of the present disclosure.

As an example, the waveform bitstream generating circuit 210 may be configured to generate a 127-bit bitstream corresponding to a double sawtooth signal. One example pattern of the bitstream may be {[0,1,0]×21, [1,0,1]×21, 0} for a total of 127 bits, as illustrated in the plot 400 of FIG. 4. In FIG. 4, the 127-bit double sawtooth signal 401 is normalized such that the amplitude of each segment is equal to 1. For time-interleaved ADC calibration, the actual amplitude of the signal (e.g., the double sawtooth signal) may be designed to cover more than half of the dynamic range of the ADC, for example. This can be achieved by programming the current sources (I2 and/or I3) and the capacitors (C1, C2, and/or C3) in FIG. 3.

The ramp-down portion 402 of the normalized double sawtooth signal 401 has a bit pattern of {0,1,0}, whereas the ramp-up portion 404 has a bit pattern of {1,0,1}, as illustrated in FIG. 4. Thus, the double sawtooth signal 401 (or more specifically, one period of the double sawtooth signal 401) includes a low-frequency portion (e.g., a negative slope line corresponding to the ramp-down portion 402 and a positive slope line corresponding to the ramp-up portion 404), combined with a high-frequency portion (e.g., the jagged deviations from the negative and positive slope lines, due to the bit patterns of {0,1,0} and {1,0,1}). By having both low and high frequency components, the double sawtooth signal 401 may be suitable for both gain and timing skew calibrations of the time-interleaved ADC. Also, the total number of bits in the bit pattern (here, 127) is a prime number and is indivisible by the number of channels 106 (e.g., 8 channels). Therefore, when sampling over multiple periods of the 127-bit double sawtooth signal 401, each of the different channels 106 will be able to see all points of the signal, rather than sampling the same $m^{th}$ points (e.g., every $8^{th}$ point for a time-interleaved ADC with 8 channels) of the signal 401 if the total number of bits was a multiple of the number of channels.

As another example, the waveform bitstream generating circuit 212 may be configured to generate a 63-bit bitstream corresponding to a double sawtooth signal. In this case, one example pattern of the bitstream may be {[0,1,0]×10, [1,0,1]×11} for a total of 63 bits (per period). Similar to the example above, the ramp-down portion of the 63-bit double sawtooth signal has a bit pattern of {0,1,0}, whereas the ramp-up portion has a bit pattern of {1,0,1}. The 63-bit double sawtooth signal also includes a low frequency component and a high frequency component and may therefore be suitable for both gain and timing skew calibration of a time-interleaved ADC. Although 63 is not a prime number, 63 shares no common factor with the number of channels being 8, for example.

As yet another example, the waveform bitstream generating circuit 214 may be configured to generate a bitstream corresponding to a single sawtooth signal (e.g., a ramp in one direction). The waveform bitstream generating circuit 214 may generate the bitstream by performing a frequency division by 3 of the incoming periodic signal. Frequency division by 3 may guarantee every channel 106 sees different samples in certain cases where the number of channels is indivisible by 3 (e.g., 8 channels). A single sawtooth signal may be suitable for timing skew calibration of a time-interleaved ADC.

As yet another example, the waveform bitstream generating circuit 216 may be configured to generate a bitstream corresponding to a linear feedback shift register (LFSR) sequence for pseudorandom sequence data pattern generation. For example, the LFSR sequence may have two modes, which can be 6-bit or 7-bit LFSR, as illustrated in Table 1. The LFSR sequence may be appropriate for gain calibration. The resulting waveform associated with the LFSR sequence has a probability density function (PDF) similar to a Gaussian distribution, which resembles wideband signal behavior.

TABLE 1

| LFSR_mode | Bits | Feedback polynomial | Period | Pattern |
| --- | --- | --- | --- | --- |
| 0 | 6 | $x^6 + x^5 + 1$ | 63 bit | 32 zeros, 31 ones |
| 1 | 7 | $x^7 + x^6 + 1$ | 127 bit | 64 zeros, 63 ones |

Example Timing Skew Calibration

For timing skew determination and adjustment in a time-interleaved ADC, each sub-ADC 110 (e.g., each SAR ADC) may be equipped with a programmable delay 111 (e.g., a skew tuner) for generating the channel clock signal 113 from the output of the channel clock generator 112, as illustrated in FIG. 1. During calibration, the skew tuner in each channel 106 may adjust the sampling delay in producing the channel clock signal 113 associated with each sub-ADC 110 in an effort to minimize the timing skew between different channels. There are at least two approaches for adjusting the timing skew setting. In the first approach, the most lagging channel is left untouched, and the other channels are delayed to match the most lagging channel. Although this first approach introduces minimal extra jitter to the time-interleaved ADC, the residual sideband (RSB) may suffer since the variation of the most lagging channel of in-phase (I) and quadrature (Q) (e.g., for wireless communications, one time-interleaved ADC for each of I and Q) determines the RSB due to timing mismatch. The RSB due to timing mismatch can be addressed by using a common signal generator for both I and Q, but this may compromise I/Q isolation. In the second approach, the skew between different channels may be adjusted around the average skew, so that the initial average and final average after calibration are equal. While the second approach has minimum degradation to the RSB, the second approach may introduce extra jitter into the ADC. The choice between these two approaches may depend on the strategy of the design for yield purposes. If the design goal is to meet the jitter specification even at the worst skew, more area and power may be allocated to the skew tuner to meet the jitter, even at the longest skew setting. In this case, the second approach may be more desirable. However, if the design strategy is to improve the majority of the chips, the first approach may be more desirable since the probability of having large skews is less.

For certain aspects, timing skew estimation may utilize a double sawtooth signal as described above, which may be the same signal used for gain calibration. As described above, the double sawtooth signal may be generated by integrating a differential current on one or more capacitors (C1, C2, C3), according to a bitstream 220. For certain aspects, as described above, the bit pattern chosen for switching the current is [{0,1,0}×21, {1,0,1}×21, 0], which has a period of 127×T, where T is the time span per segment.

Figure 5A:
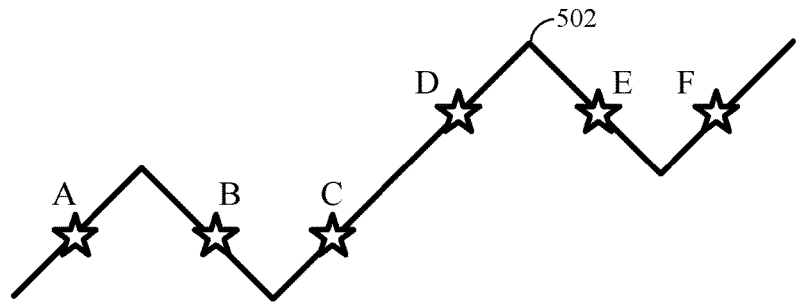
FIGS. 5A-5C illustrate ADC samples of a portion of a double sawtooth signal with perfect alignment, with a leading timing skew, and with a lagging timing skew, respectively, in accordance with certain aspects of the present disclosure.

FIG. 5A shows a small part of a double sawtooth waveform 502 at the output of the signal generator 102. In particular, the portion shown in FIG. 5A represents the bit pattern {1,0,1}×2 during the ramp-up portion 404. Each segment (each bit of the sequence 1,0,1,1,0,1) corresponds to one period of the clock signal 116. Stars on the waveform indicate the sampling moment of a sub-ADC 110. Since there are 8 channels 106 in the example ADC of FIG. 1, the first sample (A) is taken by channel 1, sample B is taken by channel 2, sample C by channel 3, and so on. Because the period of the double sawtooth signal is 127 bits, 128 clock cycles later channel 2 samples A, channel 3 samples B, and so on. Thus, two consecutive samples of the double sawtooth ramp statistically exist at the output of each sub-ADC 110, but these samples are 128×(clock period) apart in time, which means at the output of each channel 106, the samples are 16 (=128/8) channel clock cycles apart. For example if F is the last sample that channel 1 has taken, the $Z^{-16}$ sample is E, $Z^{-32}$ is D, etc. These samples can be used to reconstruct the original double sawtooth signal at the output of each channel 106.

Figure 5B:
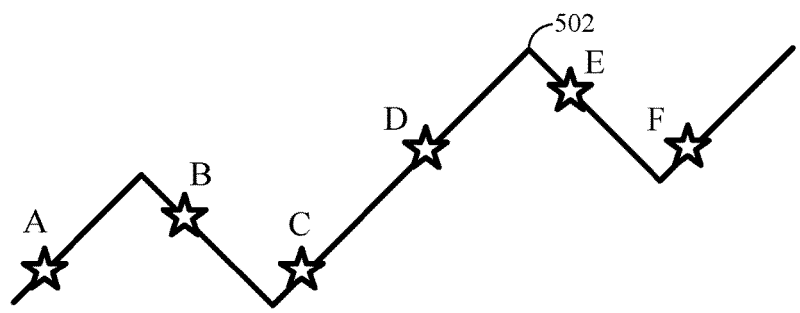
Figure 5C:
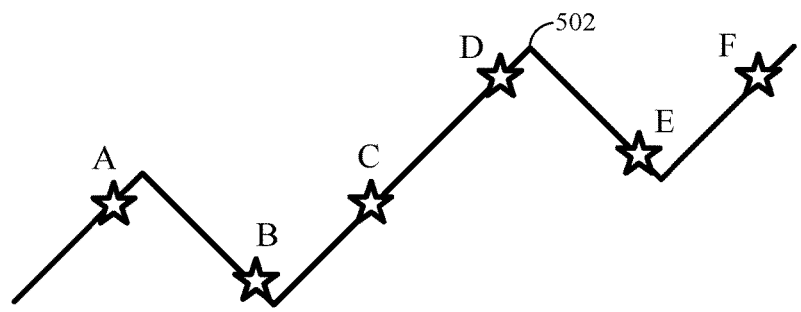

The sampling moments in FIG. 5A illustrate an ideal case, where there is no timing skew between channels 106 and, thus, each sampling moment is perfectly aligned in the middle of the segment. FIG. 5A can also be considered as illustrating the ideal case for a single channel under calibration, where there is no timing skew between the sampling clock of the channel and the clock signal for the signal generator 102 (which may be the same as the main ADC sampling clock signal 116). If the sampling clock of the channel under calibration is leading the signal generator clock signal (as illustrated in FIG. 5B) the samples are taken slightly earlier than the ideal case (as shown in FIG. 5A). If the sampling clock of the channel under calibration is lagging the signal generator clock signal, the output will be similar to FIG. 5C. By subtracting consecutive samples in FIGS. 5B and 5C, information about a leading or lagging channel clock signal can be extracted.

Figure 6:
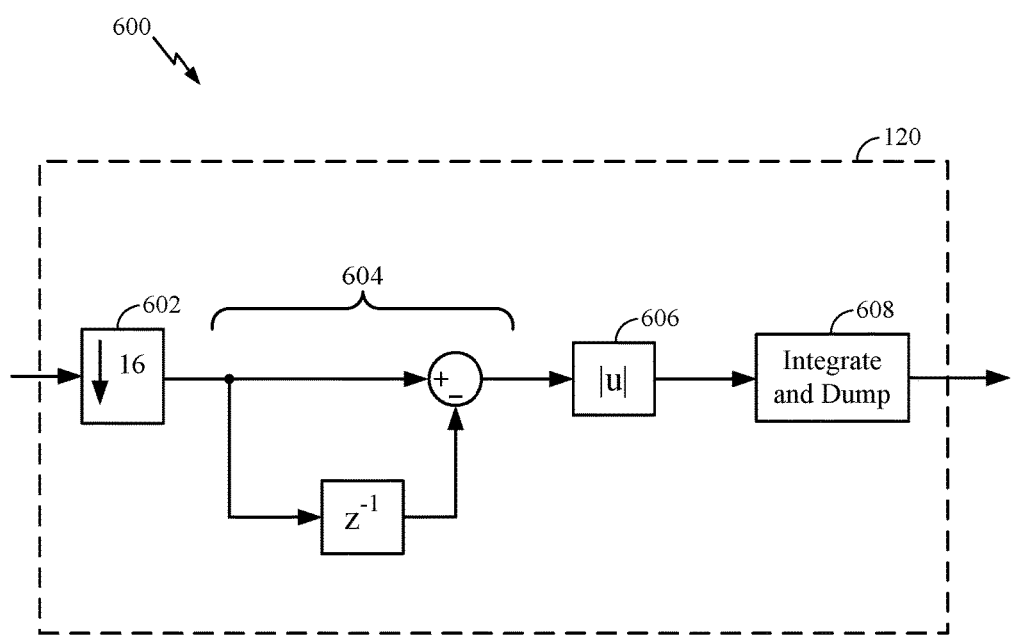
FIG. 6 is a block diagram of example coarse timing measurement logic, in accordance with certain aspects of the present disclosure.

FIG. 6 is a block diagram of example coarse timing measurement logic 600, in accordance with certain aspects of the present disclosure. For example, the coarse timing measurement logic 600 may be implemented in the timing measurement block 120 of each channel 106. The coarse timing measurement logic 600 may include a downsampling block 602, a differentiator 604, an absolute value block 606, and an integrate and dump block 608. The downsampling block 602 may be configured to select consecutive samples by downsampling according to the total number of bits in the bitstream's pattern (e.g., 127) divided by the number of channels (e.g., 8), for the particular channel to see the next consecutive sample. Thus, for the 127-bit double sawtooth signal and 8 channels, the downsampling block 602 in each channel downsamples by 16. Although the downsampling block 602 of FIG. 16 illustrates downsampling by 16, the reader is to understand that, based on the relationship described above, this downsampling number may be greater than or equal to 16.

Figure 7:
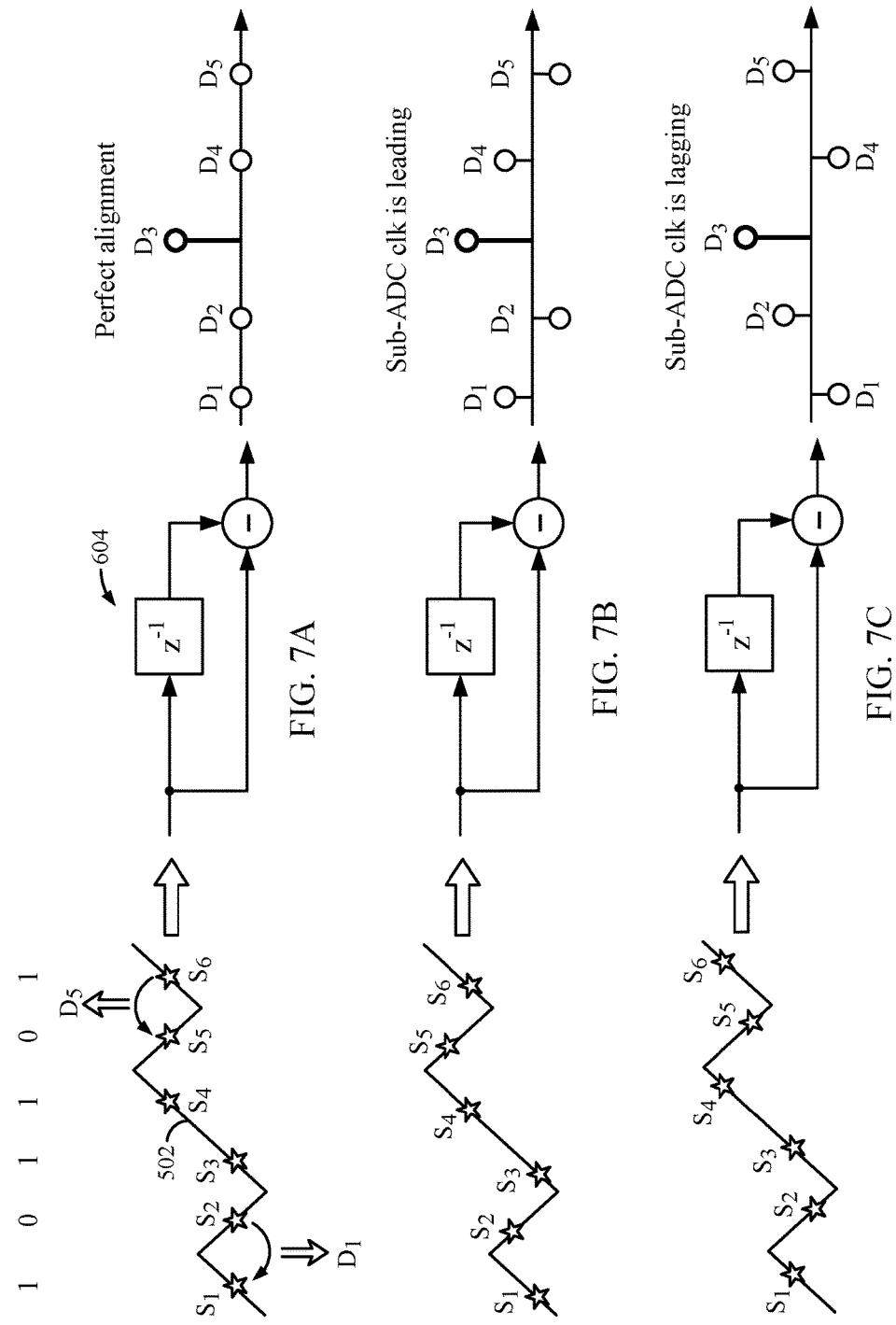
FIGS. 7A-7C illustrate example outputs of a differentiator in the coarse timing measurement logic of FIG. 6 for the ADC samples of FIGS. 5A-5C, respectively, in accordance with certain aspects of the present disclosure.

FIGS. 7A-7C depict the output of the differentiator 604 for perfect alignment, for the channel clock signal 113 leading the clock signal 116, and for the channel clock signal 113 lagging the clock signal 116, respectively. Thus, in FIG. 7A for perfect alignment, the difference between consecutive sampling moments $S_2$ and $S_1$ is zero (e.g., ½-½=0) and corresponds to the differential output $D_1$. Similarly, the difference between consecutive sampling moments $S_3$ and $S_2$ is zero for perfect alignment and corresponds to the differential output $D_2$. However, the difference between consecutive sampling moments $S_4$ and $S_3$ is one (e.g., 1½-½=1, where each segment has an amplitude of 1 as described above) and corresponds to the differential output $D_3$. For perfect alignment in FIG. 7A, the difference between consecutive sampling moments $S_5$ and $S_4$ (or between $S_6$ and $S_5$) is zero and corresponds to the differential output $D_4$ (or $D_5$).

For the leading channel clock signal of FIG. 7B, the differential outputs $D_1$ and $D_4$ have positive values less than 1, the differential outputs $D_2$ and $D_5$ have negative values greater than −1, and the differential output $D_3$ has a value of 1, as shown. In contrast, for the lagging channel clock signal of FIG. 7C, the differential outputs $D_1$ and $D_4$ have negative values greater than −1, the differential outputs $D_2$ and $D_5$ have positive values less than 1, and the differential output $D_3$ has a value of 1, as shown. These characteristic patterns at the output of the differentiator 604 can be used to determine the timing skew of the channel clock signal 113 with respect to the clock signal 116.

A rough estimation of timing skew can be obtained by calculating the power of the output of the differentiator 604, and hence, the absolute value block 606 takes the absolute value of the difference calculated by the differentiator. This measurement is used for coarse timing estimation. The integrate and dump block 608 may integrate and dump the absolute value of the difference between the consecutive samples. A drawback of the coarse timing estimation is that the output of the coarse timing estimator is always positive regardless whether the channel clock signal is leading or lagging. For example, a 1 ps lag or 1 ps lead results in the same value at the output of the coarse timing estimator. Thus, the goal of the calibration algorithm may be to minimize the output of the coarse timing estimator.

Figure 8:
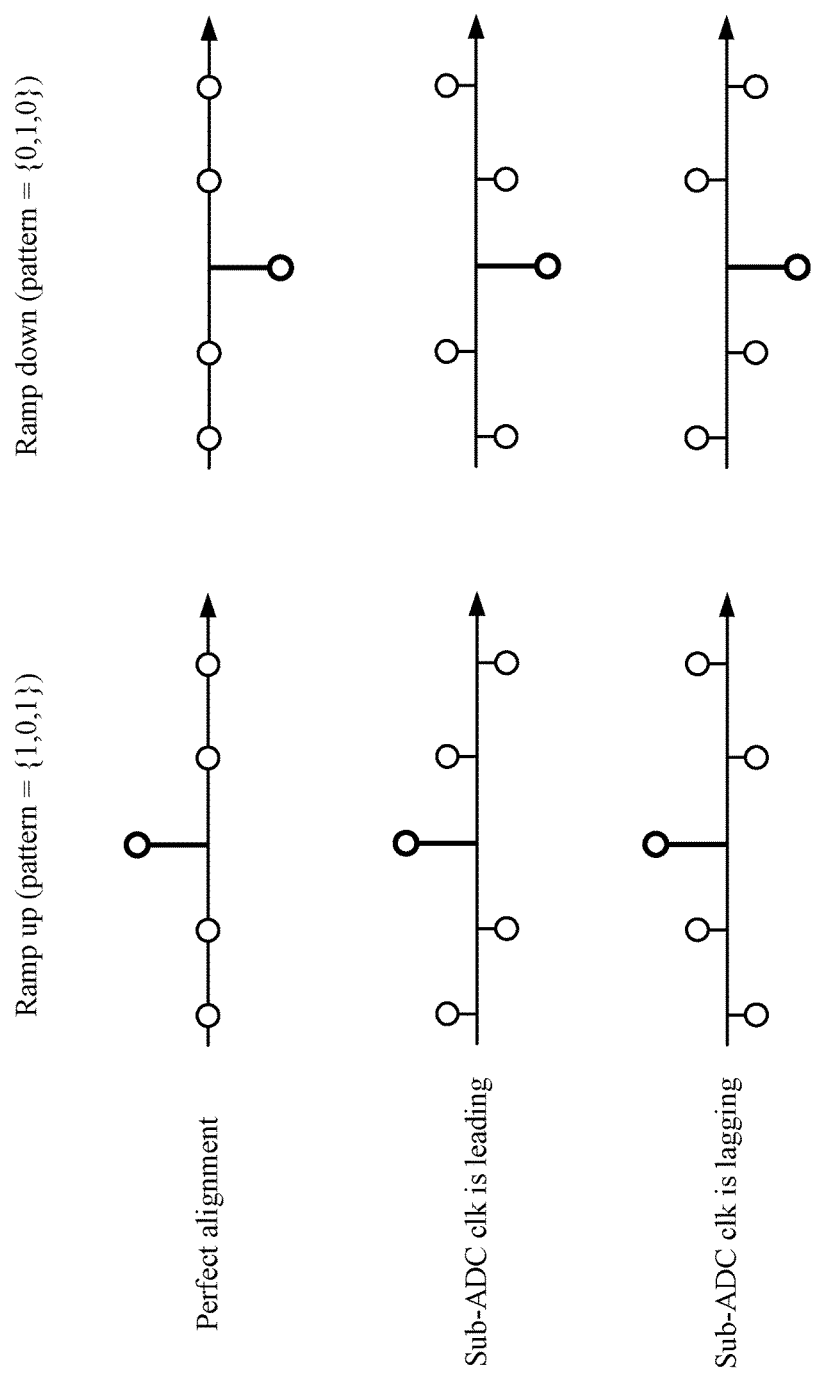
FIG. 8 summarizes example outputs of a differentiator in the coarse timing measurement logic of FIG. 6 for ADC samples of both ramping up and ramping down portions of a double sawtooth signal with perfect alignment, with a leading timing skew, and with a lagging timing skew, in accordance with certain aspects of the present disclosure.
Figure 9:
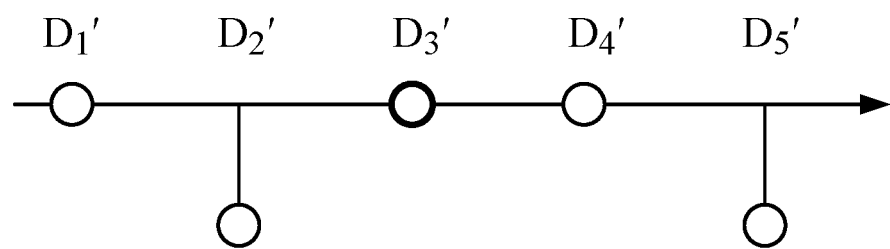
FIG. 9 illustrates an example output of fine timing measurement logic before an integrate and dump, in accordance with certain aspects of the present disclosure.

To assist with fine estimation of timing skew, it can be shown that during the low frequency ramp down of the double sawtooth waveform (e.g., the ramp-down portion 402), the output of the differentiator 604 has opposite sign compared to the examples shown in FIGS. 7A-7C, which represent a portion of the ramp up of this waveform (the ramp-up portion 404). FIG. 8 summarizes the output of the differentiator 604 during ramp up and ramp down of the double saw tooth signal. It may be noted that the amplitude of every third differential output (e.g., $D_3$) is much larger than the amplitude of the other differential outputs (e.g., $D_1$, $D_2$, $D_4$, and $D_5$) and is constant regardless of timing mismatch. This information can be utilized for two purposes: (1) to mask the third differential outputs by multiplying them with zero, for example; and (2) the sign of the third differential outputs can be used to determine if the double sawtooth signal is ramping up or down, hence adjusting for the sign of the other differential outputs. To detect the third differential outputs, a comparator may be used to compare each differential output with a positive threshold value (+VTH) and a negative threshold value (−VTH). The threshold voltage, VTH, is about half of the expected amplitude of the third differential output. The comparator output is logic high if the differential output is smaller than −VTH, zero if the differential output is between −VTH and +VTH, and −1 if the differential output is higher than +VTH. If the output of the comparator is zero for two consecutive samples, then the other differential outputs (e.g., $D_1$, $D_2$, $D_4$, and $D_5$) are being processed. By differentiating the last two differential outputs and multiplying the difference by the sign of the two differential outputs before (i.e., a +1 or −1, associated with the prior third differential output), a signal sequence suitable for fine channel clock skew estimation is obtained. FIG. 9 shows the processed differential outputs ($D_1'$–$D_5'$) described above for the case of a leading channel clock signal during ramping up and ramping down (the outputs are the same for both up and down).

For certain aspects, the VTH used in fine timing calibration may be predetermined before calibration. For other aspects, the VTH may be adaptively set, for example, based on the output of the gain measurement during calibration. The fine tune timing estimation may be linearly proportional to the timing skew of the channel clock signal.

Figure 10:
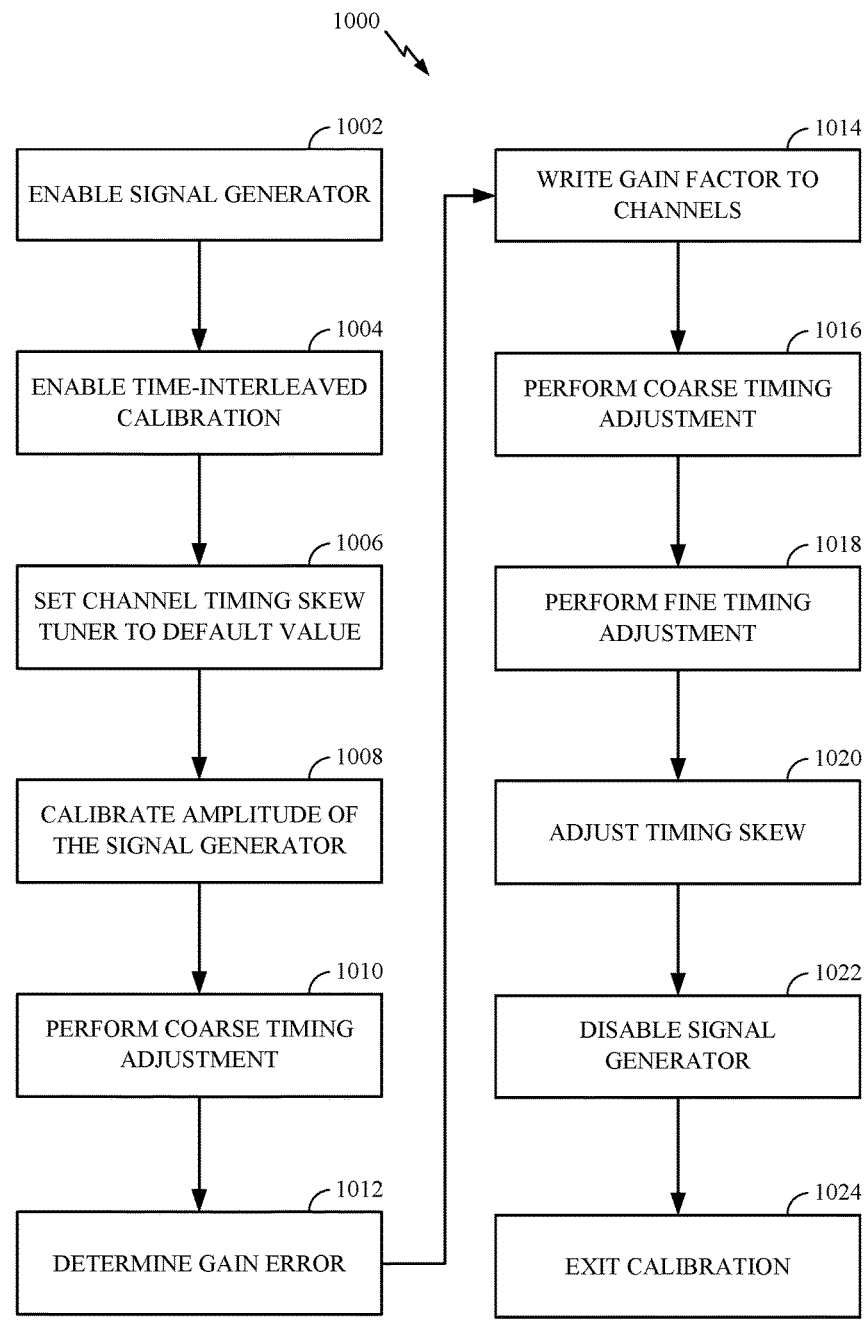
FIG. 10 is a flow diagram of example operations for calibrating a time-interleaved ADC circuit, in accordance with certain aspects of the present disclosure.

FIG. 10 is a flow diagram of example operations 1000 for calibrating a time-interleaved ADC circuit (e.g. the ADC circuit 100 of FIG. 1), in accordance with certain aspects of the present disclosure. The operations 1000 may be performed during foreground calibration, meaning that the calibration is performed before the time-interleaved ADC circuit operates in mission mode to convert actual signals, as opposed to calibration signals. Time inter-leaved calibration may be performed with the same clock frequency and sub-ADC settings as mission mode. However, an anti-aliasing filter (AAF) may be disconnected from the input of the ADC circuit, which is driven by a signal generator.

The operations 1000 may begin, at block 1002, with the time-interleaved ADC circuit starting up from sleep (or after a reset, for certain aspects) and enabling (or connecting) a signal generator (e.g., signal generator 102) coupled to the input of the time-interleaved ADC circuit. During this time, there may be a waiting period for the common-mode feedback of the signal generator to settle. At block 1004, the time-interleaved calibration logic (e.g., portions of the adjustment circuitry 114) may be enabled in each channel (e.g., channel 106) of the ADC circuit. At block 1006, the timing skew tuner (e.g., programmable delay 111) for each channel may be set to a default value (e.g., mid-code).

At block 1008, the amplitude of the signal generator may be calibrated. For certain aspects, this may involve reading the output of a gain measurement and adjusting the current and capacitance of the signal generator (namely, the conversion circuit) to achieve a specified average gain measurement reading over different channels.

At block 1010, coarse timing adjustment of the signal generator may be performed, using a blind initial search, for example. For this procedure, a number of MSBs of the coarse timing measurement may be swept, and the output of the coarse timing estimator and gain estimator may be read for each setting, for each of the channels. The timing readings over different channels may be averaged (one timing average per setting), and the gain readings over different settings may be average (one gain average per channel). The setting that results in minimum estimation at the output of the coarse timing estimator averaged over different channels may be selected for the timing of the signal generator.

At block 1012, the gain error may be determined. For example, the gain factor for each channel may be calculated by normalizing to the average of the gain measurements of each channel over the different settings (calculated at block 1010). At block 1014, the calculated gain factors for all channels may be written back to finish calibrating the gain.

At block 1016, coarse timing adjustment of the signal generator may be performed, now with the calibrated gain. If a count of the expected bit pattern is below a predetermined threshold, timing information from the coarse timing estimator may be read, and the blind search (performed at block 1010) may be continued, for another number of MSBs of settings. If the count is above the threshold, the timing skew measurement may be read from the fine timing skew, and the setting with the closest timing measurement to zero may be found. At block 1018, fine timing adjustment of the signal generator may be performed. Here, the fine timing measurement may be read, and the setting that results in a fine timing measurement output closest to zero may be found. At block 1020, the timing skew may be adjusted for each channel. For example, the fine timing measurement of each channel may be read, and the skew tuning setting may be adjusted until the fine timing measurement for each channel is closest to zero. With the use of coarse and fine timing adjustments, the signal generator is effectively adjusted to the average of the channels, and then the timing skew for each channel is adjusted to that of the signal generator.

At block 1022, the signal generator may be disabled. In addition, the time-interleaved calibration logic may be disabled. At block 1024, the AAF may be connected to the input of the ADC circuit, and the ADC circuit may continue to mission mode, thereby ending time-interleaved calibration.

Figure 11:
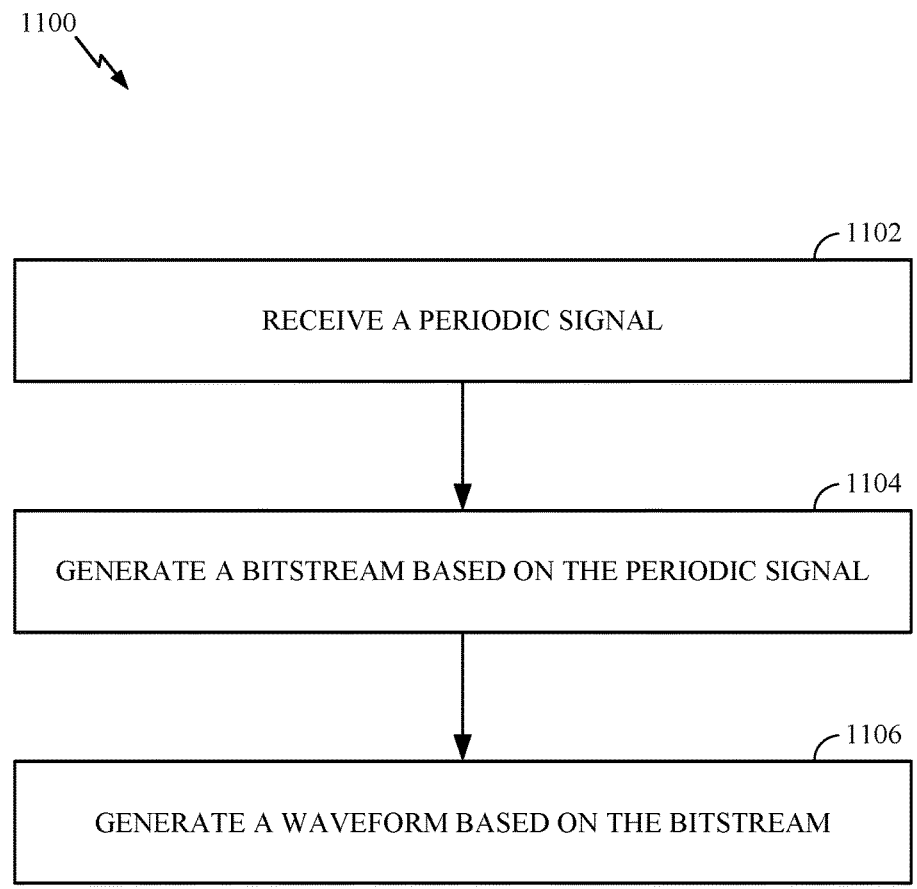
FIG. 11 is a flow diagram of example operations for generating a waveform for calibrating a time-interleaved ADC circuit, in accordance with certain aspects of the present disclosure.

FIG. 11 is a flow diagram illustrating example operations 1100 for generating a waveform for calibrating a time-interleaved ADC circuit, in accordance with certain aspects of the present disclosure. The operations 1100 may be performed by a signal generator, such as the signal generator 102 of FIGS. 1 and 2.

The operations 1100 may begin, at block 1102, with the signal generator receiving a periodic signal (e.g., a main ADC clock signal for the time-interleaved ADC circuit, such as the clock signal 116, or a clock signal based on (e.g., frequency locked to) the main ADC clock signal). At block 1104, the signal generator may generate a bitstream based on the periodic signal. The bitstream may have a bit pattern with a total number of bits that shares no common factor with a number of the channels. The bitstream may also include a relatively lower frequency component combined with a relatively higher frequency component. At block 1106, the signal generator may generate the waveform based on the bitstream.

According to certain aspects, the waveform is a double sawtooth signal. For certain aspects, the total number of bits for one period of the double sawtooth signal is 127. In this case, the number of the channels may be 8, for example. For other aspects, the total number of bits for one period of the double sawtooth signal may be 63. In this case, the number of the channels may be 8, for example. For certain aspects, the bitstream for the double sawtooth signal may include at least one of: (1) a first repeating bit pattern of $\{0,1,0\}$ for a ramping down portion of the double sawtooth signal; or (2) a second repeating bit pattern of $\{1,0,1\}$ for a ramping up portion of the double sawtooth signal. The at least one of the first repeating bit pattern or the second repeating bit pattern may provide the higher frequency component, whereas the general shape of the ramping down and/or ramping up portion may provide the lower frequency component.

According to certain aspects, generating the bitstream at block 1104 may entail selecting one of a plurality of different bitstreams as the bitstream. For certain aspects, the plurality of different bitstreams includes at least one of a first bitstream for a double sawtooth signal, a second bitstream for a single sawtooth signal, or a third bitstream based on a linear feedback shift register (LFSR) sequence.

According to certain aspects, generating the bitstream at block 1104 may involve variably delaying the periodic signal or a version of the periodic signal.

According to certain aspects, generating the bitstream at block 1104 may include dividing a frequency of the periodic signal or of a version of the periodic signal to generate a lower frequency periodic signal.

According to certain aspects, the periodic signal comprises a sampling clock signal for the time-interleaved analog-to-digital converter circuit.

Certain aspects of the present disclosure provide on-chip calibration for a time-interleaved ADC that may be performed during boot-up (foreground calibration), rather than during operation (background calibration). This foreground calibration may use signals with special frequencies prime to the ADC sampling frequency and to each channel's sampling frequency. The calibration signals may be chosen with specific statistical and/or spectral characteristics.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering.

For example, means for generating a digital bitstream may include a pattern generator, such as the pattern generator 202 as illustrated in FIG. 2. Means for generating an analog waveform may include a conversion circuit, such as the conversion circuit 204 as shown in FIG. 2. The conversion circuit may include an integrator circuit, for example, as described above and illustrated in FIG. 3.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A signal generator for calibrating a time-interleaved analog-to-digital converter (ADC) circuit having a plurality of channels, comprising:
    a pattern generator configured to receive a periodic signal and output a bitstream based on the periodic signal, wherein the bitstream:
        has a bit pattern with a total number of bits that shares no common factor with a number of the channels; and
        includes a relatively lower frequency component combined with a relatively higher frequency component; and
    a conversion circuit having an input coupled to an output of the pattern generator and configured to generate a waveform based on the bitstream, wherein the signal generator is configured to output a double sawtooth signal as the waveform.

2. The signal generator of claim 1, wherein the total number of bits for one period of the double sawtooth signal is 127.

3. The signal generator of claim 1, wherein the total number of bits for one period of the double sawtooth signal is 63 and wherein the number of the channels is 8.

4. The signal generator of claim 1, wherein the bitstream for the double sawtooth signal comprises at least one of:
    a first repeating bit pattern of {0,1,0} for a ramping down portion of the double sawtooth signal; or
    a second repeating bit pattern of {1,0,1} for a ramping up portion of the double sawtooth signal.

5. The signal generator of claim 1, wherein:
    the pattern generator comprises a multiplexer having a plurality of inputs coupled to outputs of a plurality of waveform bitstream generating circuits and an output coupled to the output of the pattern generator; and
    the multiplexer is configured to select one of the outputs of the plurality of waveform bitstream generating circuits as the bitstream output by the pattern generator.

6. The signal generator of claim 5, wherein the plurality of waveform bitstream generating circuits is configured to generate at least one of a first bitstream for a double sawtooth signal, a second bitstream for a single sawtooth signal, or a third bitstream based on a linear feedback shift register (LFSR) sequence.

7. The signal generator of claim 1, wherein the pattern generator comprises a delay tuning circuit configured to variably delay the periodic signal or a version of the periodic signal.

8. The signal generator of claim 1, wherein the pattern generator comprises a frequency dividing circuit configured to divide a frequency of the periodic signal or of a version of the periodic signal to generate a lower frequency periodic signal.

9. An integrated circuit (IC) comprising the signal generator of claim 1 and the time-interleaved analog-to-digital converter circuit, wherein an output of the conversion circuit is selectively coupled to an input of the time-interleaved analog-to-digital converter circuit.

10. The integrated circuit of claim 9, wherein the signal generator and the time-interleaved analog-to-digital converter circuit receive power from a same power supply rail.

11. The integrated circuit of claim 9, wherein the periodic signal the pattern generator is configured to receive is a sampling clock signal for the time-interleaved analog-to-digital converter circuit.

12. A method of generating a waveform for calibrating a time-interleaved analog-to-digital converter (ADC) circuit having a plurality of channels, comprising:
    receiving a periodic signal;
    generating a bitstream based on the periodic signal, wherein the bitstream:
        has a bit pattern with a total number of bits that shares no common factor with a number of the channels; and
        includes a relatively lower frequency component combined with a relatively higher frequency component; and
    generating the waveform based on the bitstream, wherein the waveform comprises a double sawtooth signal.

13. The method of claim 12, wherein the total number of bits for one period of the double sawtooth signal is 127.

14. The method of claim 12, wherein the total number of bits for one period of the double sawtooth signal is 63 and wherein the number of the channels is 8.

15. The method of claim 12, wherein the bitstream for the double sawtooth signal comprises at least one of:
    a first repeating bit pattern of {0,1,0} for a ramping down portion of the double sawtooth signal; or
    a second repeating bit pattern of {1,0,1} for a ramping up portion of the double sawtooth signal.

16. The method of claim 12, wherein generating the bitstream comprises selecting one of a plurality of different bitstreams as the bitstream.

17. The method of claim 16, wherein the plurality of different bitstreams comprises at least one of a first bitstream for a double sawtooth signal, a second bitstream for a single sawtooth signal, or a third bitstream based on a linear feedback shift register (LFSR) sequence.

18. The method of claim 12, wherein generating the bitstream comprises variably delaying the periodic signal or a version of the periodic signal.

19. The method of claim 12, wherein generating the bitstream comprises dividing a frequency of the periodic signal or of a version of the periodic signal to generate a lower frequency periodic signal.

20. The method of claim 12, wherein the periodic signal comprises a sampling clock signal for the time-interleaved analog-to-digital converter circuit.

21. An apparatus for generating an analog waveform for calibrating a time-interleaved analog-to-digital converter (ADC) circuit having a plurality of channels, the apparatus comprising:
  means for generating a digital bitstream based on a periodic signal, wherein the digital bitstream:
    has a bit pattern with a total number of bits that shares no common factor with a number of the channels; and
    includes a relatively lower frequency component combined with a relatively higher frequency component; and
  means for generating the analog waveform based on the bitstream, wherein the analog waveform comprises a double sawtooth signal.

* * * * *